(12) United States Patent
Ihara et al.

(10) Patent No.: US 11,329,019 B2
(45) Date of Patent: May 10, 2022

(54) SEMICONDUCTOR DEVICE

(71) Applicant: SOCIONEXT INC., Kanagawa (JP)

(72) Inventors: Takumi Ihara, Yokohama (JP); Masanori Natsuaki, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 16/950,789

(22) Filed: Nov. 17, 2020

(65) Prior Publication Data

US 2021/0159199 A1 May 27, 2021

(30) Foreign Application Priority Data

Nov. 27, 2019 (JP) .............................. JP2019-214041

(51) Int. Cl.
 *H01L 23/00* (2006.01)
 *H01L 23/498* (2006.01)

(52) U.S. Cl.
 CPC ........ *H01L 24/14* (2013.01); *H01L 23/49827* (2013.01); *H01L 24/48* (2013.01)

(58) Field of Classification Search
 CPC ... H01L 24/14; H01L 23/49827; H01L 24/48; H01L 23/49816; H01L 24/81; H01L 2924/15311
 See application file for complete search history.

(56) References Cited

U.S. PATENT DOCUMENTS

| | | |
|---|---|---|
| 5,598,036 A | 1/1997 | Ho |
| 6,229,099 B1 | 5/2001 | Horiuchi et al. |
| 6,570,245 B1 | 5/2003 | Ma |
| 6,680,530 B1 | 1/2004 | Pillai et al. |
| 7,345,245 B2 | 3/2008 | Govind et al. |
| 2006/0131730 A1 | 6/2006 | Nakamura |
| 2008/0308308 A1 | 12/2008 | Kobayashi |
| 2010/0155941 A1 | 6/2010 | Matsuki et al. |
| 2012/0067635 A1 | 3/2012 | Nang et al. |
| 2015/0001738 A1 | 1/2015 | Shimizu et al. |
| 2019/0221508 A1* | 7/2019 | Shimodaira ....... H01L 23/49827 |
| 2019/0333847 A1* | 10/2019 | Watanabe ......... H01L 23/49833 |
| 2020/0343169 A1* | 10/2020 | Tanaka .................... H01L 24/81 |

(Continued)

FOREIGN PATENT DOCUMENTS

| | | |
|---|---|---|
| JP | 2006-196860 A | 7/2006 |
| JP | 2008-251702 A | 10/2008 |

(Continued)

*Primary Examiner* — Douglas W Owens
(74) *Attorney, Agent, or Firm* — McDermott Will & Emery LLP

(57) ABSTRACT

A semiconductor device includes a wiring board, a semiconductor chip arranged on the wiring board, and a plurality of bumps arranged between the wiring board and the semiconductor chip, wherein the wiring board includes a first conductor, a second conductor, a third conductor, a first via, a second via, and a third via, wherein the second conductor is arranged at a position closer to a center of the semiconductor chip than the first conductor is to the center, as seen in a thickness direction, the first conductor and the second conductor are arranged next to each other without another conductor interposed therebetween, as seen in the thickness direction, and a first distance between the first conductor and the second conductor is larger than a second distance between the first conductor and the third conductor.

8 Claims, 9 Drawing Sheets

(56) References Cited

U.S. PATENT DOCUMENTS

| 2021/0287975 A1* | 9/2021 | Raorane | H01L 23/49838 |
| 2021/0296219 A1* | 9/2021 | Yen | H01L 23/5384 |

FOREIGN PATENT DOCUMENTS

| JP | 2012-064911 A | 3/2012 |
| JP | 2015-012237 A | 1/2015 |
| JP | 2017-017215 A | 1/2017 |
| WO | 2009/013826 A1 | 1/2009 |

* cited by examiner

SEMICONDUCTOR DEVICE

CROSS-REFERENCE TO RELATED APPLICATION

The present application claims priority to Japanese Patent Application No. 2019-214041, filed on Nov. 27, 2019, which is incorporated herein by reference in its entirety.

FIELD

The embodiments discussed herein are related to a semiconductor device.

BACKGROUND

A semiconductor chip mounted on a wiring board in such an orientation that the top surface of the wiring board faces the top surface of the semiconductor chip is known.

SUMMARY

According to an aspect of an embodiment, a semiconductor device includes:
a wiring board;
a semiconductor chip arranged on the wiring board; and
a plurality of bumps arranged between the wiring board and the semiconductor chip to connect the wiring board and the semiconductor chip,
wherein the wiring board includes:
a first conductive trace layer including a first conductive trace;
a second conductive trace layer arranged on the first conductive trace layer and including a second conductive trace;
a third conductive trace layer arranged on the second conductive trace layer and including a third conductive trace;
a first conductor arranged on the third conductive trace layer;
a second conductor arranged on the third conductive trace layer and electrically insulated from the first conductor;
a third conductor arranged on the third conductive trace layer and electrically insulated from the first conductor;
a first via connecting the first conductive trace and the second conductive trace;
a second via connecting the second conductive trace and the third conductive trace; and
a third via connecting the third conductive trace and the first conductor,
wherein the first conductor, the second conductor, and the third conductor are provided in a plane parallel to a principal surface of the wiring board,
one of the plurality of bumps is arranged on the first conductor,
the second conductor is arranged at a position closer to a center of the semiconductor chip than the first conductor is to the center, as seen in a thickness direction of the wiring board,
the first conductor and the second conductor are arranged next to each other without another conductor interposed between the first conductor and the second conductor, as seen in the thickness direction of the wiring board,
the third conductor is spaced apart from the first conductor and the second conductor, as seen in the thickness direction of the wiring board, and
a first distance between the first conductor and the second conductor is larger than a second distance between the first conductor and the third conductor.

The object and advantages of the invention will be realized and attained by means of the elements and combinations particularly pointed out in the claims. It is to be understood that both the foregoing general description and the following detailed description are exemplary and explanatory and are not restrictive of the invention.

DESCRIPTION OF EMBODIMENT

Figure 1:
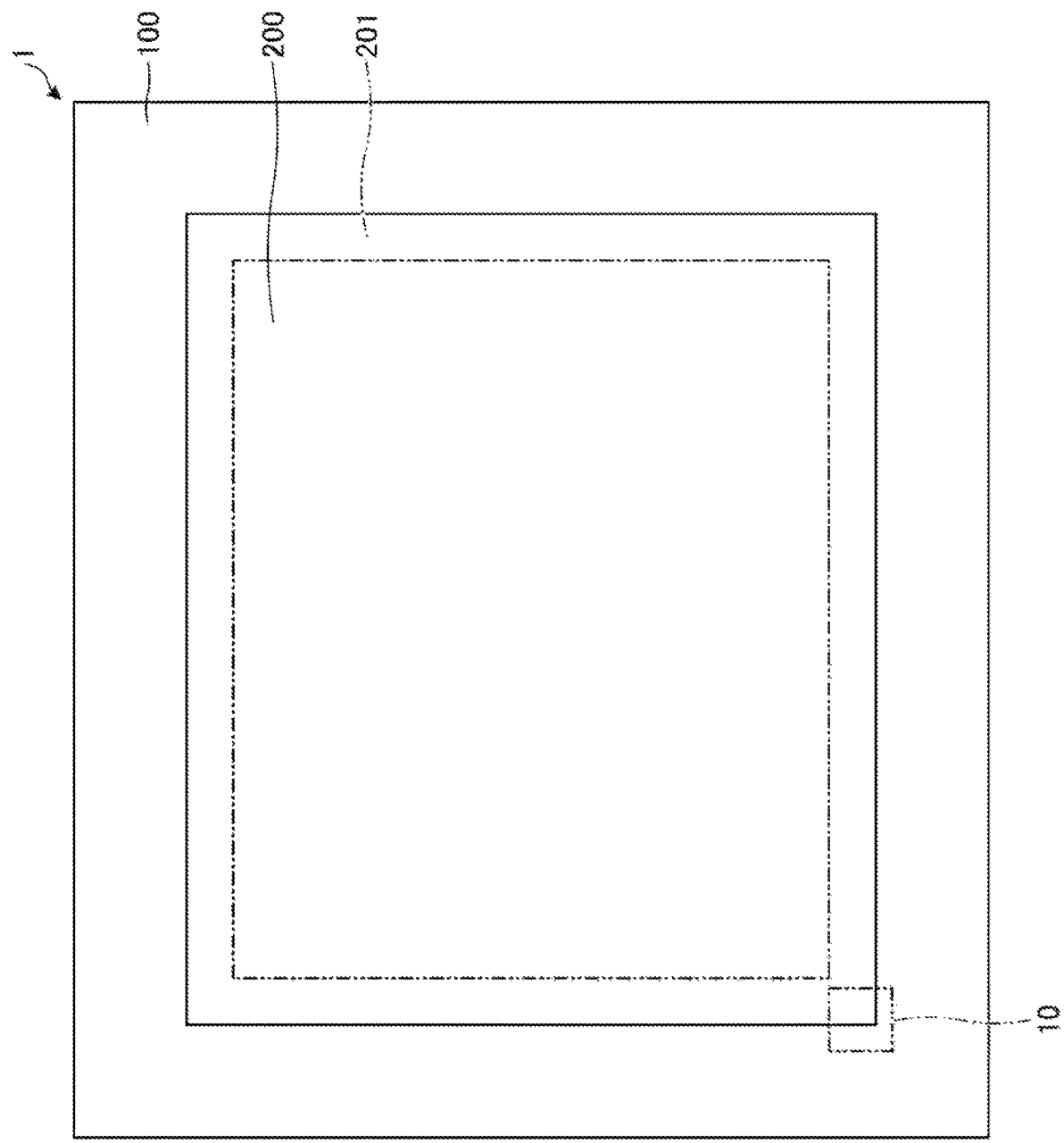
FIG. 1 is a plan view schematically illustrating a semiconductor device.

For example, as disclosed in Japanese Laid-open Patent Publication No. 2006-196860, Japanese Laid-open Patent Publication No. 2008-251702, Japanese Laid-open Patent Publication No. 2012-064911, Japanese Laid-open Patent Publication No. 2015-012237, Japanese Laid-open Patent Publication No. 2017-017215, and International Publication No. 2009/013826, a semiconductor chip may be mounted on a wiring board in such an orientation that the top surface of the wiring board faces the top surface of the semiconductor chip. Bumps are used to connect the wiring board and the semiconductor chip. Not only the bumps but also other conductive traces are formed on the top surface of the wiring board, and an insulating layer is provided between the bumps and the conductive traces.

During mounting process, a crack may occur in the insulating layer, which may short-circuit the bumps and the conductive traces.

Therefore, it is desired to provide a semiconductor device capable of reducing short-circuits due to cracks.

Hereinafter, embodiments are specifically described with reference to the attached drawings. In the present specification and drawings, constituent elements having substantially the same functional configurations may be denoted by the same reference numerals, and duplicate explanations thereabout are omitted. In the present disclosure, an expression, "any given element coincides with another element", should not be strictly interpreted as excluding elements misaligned due to manufacturing variation, and it should be understood that even if the elements are misaligned due to such manufacturing variation, such elements may be considered to coincide with each other.

First Embodiment

Figure 2:
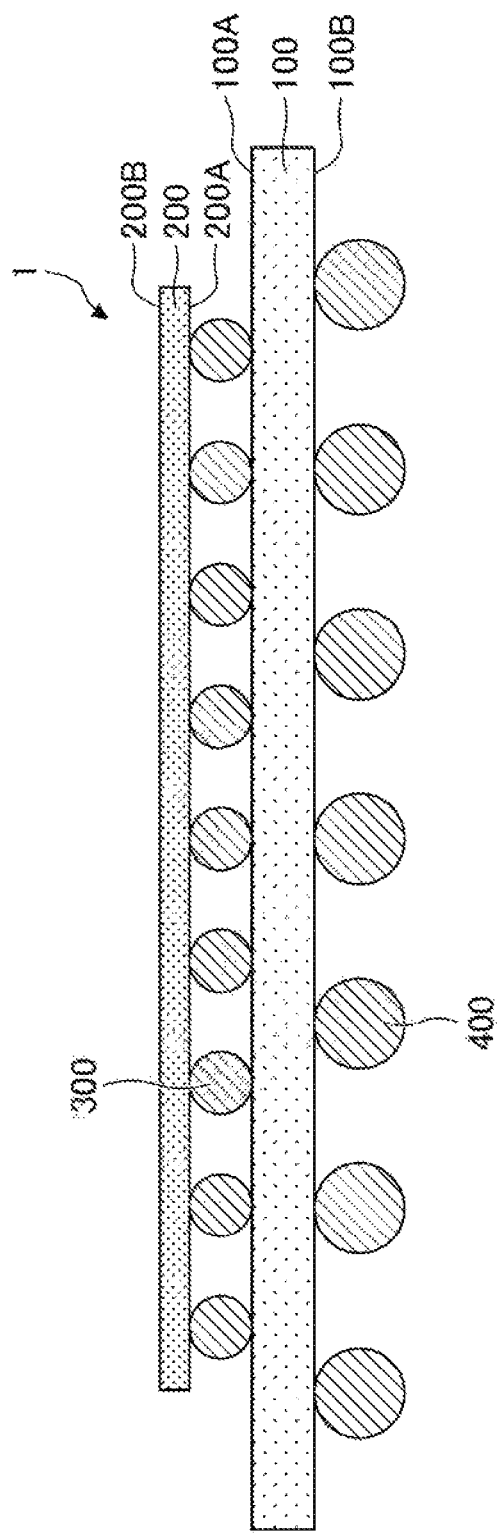
FIG. 2 is a cross sectional view schematically illustrating the semiconductor device.

First, the first embodiment is explained. FIG. 1 is a plan view schematically illustrating a semiconductor device. FIG. 2 is a cross sectional view schematically illustrating the semiconductor device.

As illustrated in FIG. 1 and FIG. 2, the semiconductor device 1 according to the first embodiment includes a wiring board 100 and a semiconductor chip 200. The wiring board 100 includes a first principal surface 100A and a second principal surface 100B on the opposite side from the first principal surface 100A. Multiple pads 124X (see FIG. 3 and FIG. 4) are formed on the first principal surface 100A, and multiple pads (not illustrated) are formed on the second principal surface 100B. The semiconductor chip 200 includes a first principal surface 200A and a second principal surface 200B on the opposite side from the first principal surface 200A. Multiple pads (not illustrated) are formed on the first principal surface 200A. The first principal surface 100A and the first principal surface 200A are facing each other. The pads 124X formed on the first principal surface 100A and the pads formed on the first principal surface 200A are connected via bumps 300. External connection terminals 400 are provided on the pads formed on the second principal surface 100B. As described above, the semiconductor device 1 has what is termed as a flip chip ball grid array (FC-BGA) structure. In FIG. 2, only nine bumps 300 are illustrated in the direction parallel to the first principal surface 100A, but not only the illustrated nine bumps 300 but also more non-illustrated bumps 300 may be provided.

Figure 3:
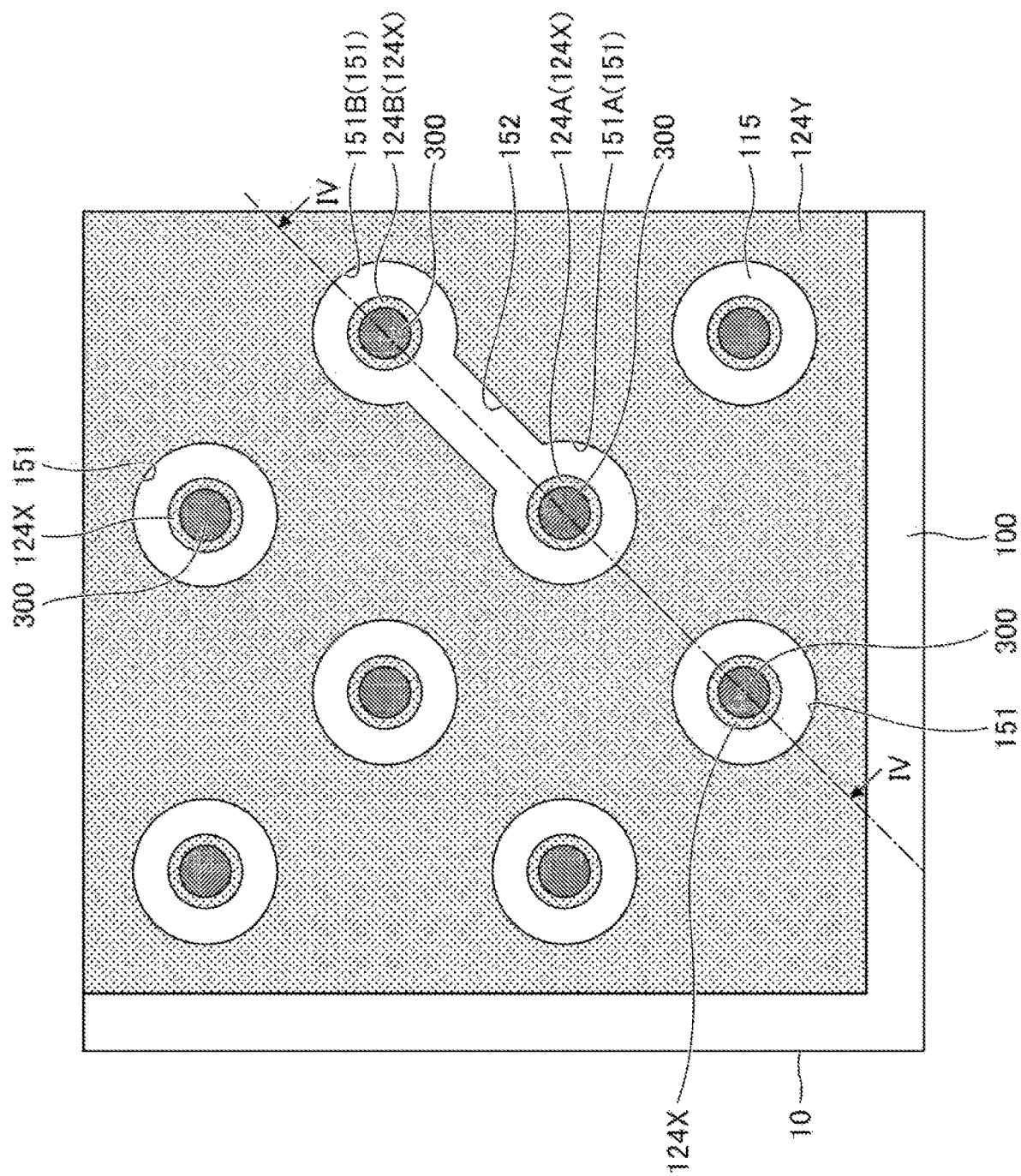
FIG. 3 is a plan view illustrating an area of FIG. 1 according to a first embodiment.
Figure 4:
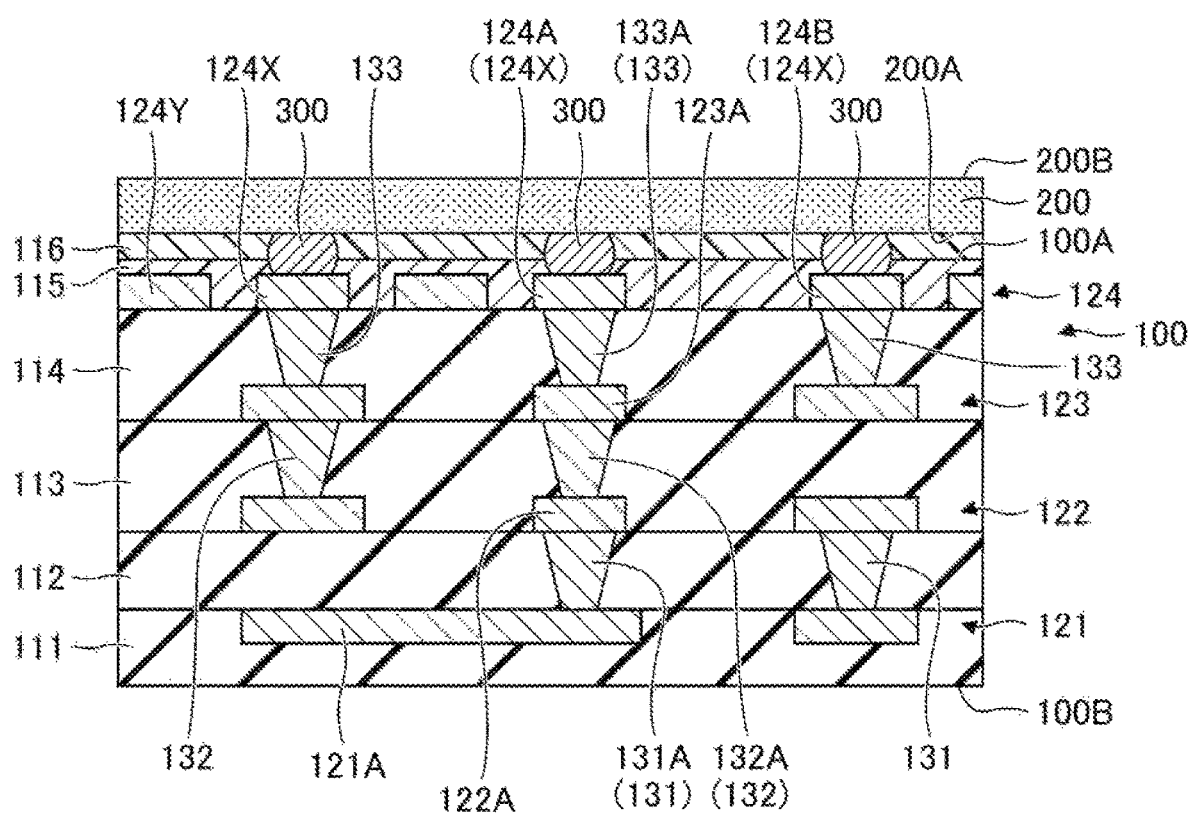
FIG. 4 is a cross sectional view illustrating the area of FIG. 1 according to the first embodiment.

Hereinafter, the wiring board 100 is explained in detail. FIG. 3 is a plan view illustrating an area 10 of FIG. 1 according to the first embodiment. In FIG. 3, the bumps 300 and the like are illustrated as if they are seen through the semiconductor chip 200 and the like. FIG. 4 is a cross sectional view, taken along line IV-IV of FIG. 3, illustrating the area 10 according to the first embodiment. The area 10 includes a part of a peripheral area 201 of the semiconductor chip 200. For example, the planar shape of the semiconductor chip 200 is a rectangle, and the peripheral area 201 is a peripheral area that includes the edges of the semiconductor chip 200. For example, the width of the peripheral area 201 is 25% of the distance between the edge of the semiconductor chip 200 and the center of the semiconductor chip 200.

The wiring board 100 includes a first insulating layer 111, a second insulating layer 112 arranged on the first insulating layer 111, a third insulating layer 113 arranged on the second insulating layer 112, and a fourth insulating layer 114 arranged on the third insulating layer 113.

An upper shallow portion of the first insulating layer 111 is formed with a first conductive trace layer 121. The first conductive trace layer 121 includes a first conductive trace 121A.

In the second insulating layer 112, multiple via holes penetrating the second insulating layer 112 and reaching the first conductive trace layer 121 are formed, and vias 131 are formed in the respective via holes. The multiple vias 131 include a first via 131A connected to the first conductive trace 121A. A second conductive trace layer 122 is formed on the second insulating layer 112. The second conductive trace layer 122 includes a second conductive trace 122A connected to the first via 131A.

In the third insulating layer 113, multiple via holes penetrating the third insulating layer 113 and reaching the second conductive trace layer 122 are formed, and vias 132 are formed in the respective via holes. The multiple vias 132 include a second via 132A connected to the second conductive trace 122A. A third conductive trace layer 123 is formed on the third insulating layer 113. The third conductive trace layer 123 includes a third conductive trace 123A connected to the second via 132A.

In the fourth insulating layer 114, multiple via holes penetrating the fourth insulating layer 114 and reaching the third conductive trace layer 123 are formed, and vias 133 are formed in the respective via holes. The multiple vias 133 include a third via 133A connected to the third conductive trace 123A. A fourth conductive trace layer 124 is formed on the fourth insulating layer 114. The fourth conductive trace layer 124 includes: multiple pads 124X connected to the respective vias 133; and a conductive trace 124Y. The multiple pads 124X and the conductive trace 124Y are provided in the plane in parallel to the first principal surface 100A. The conductive trace 124Y is formed all over the fourth insulating layer 114. Opening parts 151 provided in association with the respective vias 133 to expose the respective vias 133 are formed in the conductive trace 124Y formed all over the fourth insulating layer 114. The planar shape of the opening part 151 is a circle. The pads 124X are provided on the inside of the opening part 151. The opening parts 151 and the pads 124X are arranged in a lattice arrangement as seen in the thickness direction of the wiring board 100. The planar shape of the pad 124X is a circle, and as seen in the thickness direction of the wiring board 100, the center of the opening part 151 coincides with the center of the pad 124X.

The multiple pads 124X include: a first pad 124A connected to the third via 133A; and a second pad 124B connected to a via 133 that is different from the third via 133A. The first pad 124A and the second pad 124B are electrically insulated from the conductive trace 124Y. As seen in the thickness direction of the wiring board 100, the second pad 124B is provided, between the first pad 124A and the center of the semiconductor chip 200, on a straight line extending in a direction from the periphery of the semiconductor chip 200 to the center of the semiconductor chip 200. In other words, the second pad 124B is arranged at a position closer to the center of the semiconductor chip 200 than the first pad 124A. The straight line may or may not pass through the center of the semiconductor chip 200. The first pad 124A and the second pad 124B are next to each other. The conductive trace 124Y is formed with an opening part 152 that connects an opening part 151A around the first pad 124A and an opening part 151B around the second pad 124B.

For example, as seen in the thickness direction of the wiring board 100, the center of the first via 131A, the center of the second via 132A, and the center of the third via 133A coincide with each other. The first via 131A, the second via 132A, and the third via 133A overlap with each other as seen in the thickness direction of the wiring board 100.

A solder resist layer 115 is provided on the fourth conductive trace layer 124. The solder resist layer 115 fill the opening parts 151 and 152. Nothing but the solder resist layer 115 may exist between the first pad 124A and the second pad 124B. In the solder resist layer 115, an opening part is formed to expose the pad 124X. Through this opening part, the bump 300 is provided on the pad 124X. The bump 300 connects the pad 124X formed on the first principal surface 100A and a pad formed on the first principal surface 200A. The bumps 300 are formed in a lattice arrangement as seen in the thickness direction of the wiring board 100. The space between the first principal surface 100A and the first principal surface 200A is filled with an underfill resin 116.

As described above, the conductive trace 124Y is formed all over the fourth insulating layer 114. However, between the first pad 124A and the second pad 124B, the opening part is formed in the conductive trace 124Y, and the first pad 124A and the second pad 124B are next to each other without any other conductor interposed therebetween as seen in the thickness direction of the wiring board 100. As seen in the thickness direction of the wiring board 100, the conductive trace 124Y is arranged spaced apart from the first pad 124A and the second pad 124B.

In the first embodiment, a first distance between the first pad 124A and the second pad 124B is equal to a distance between the edge of the first pad 124A on the side closer to the second pad 124B and the edge of the second pad 124B on the side closer to the first pad 124A. A second distance between the first pad 124A and the conductive trace 124Y is equal to a difference between the radius of the opening part 151 and the radius of the first pad 124A. Therefore, the first distance is larger than the second distance.

In the production process of the semiconductor device 1, for example, after the underfill resin 116 is provided, the reflow for mounting the external connection terminals 400 is performed. There is a big difference between the coefficient of thermal expansion of the wiring board 100 and the coefficient of thermal expansion of the semiconductor chip 200. Accordingly, during the reflow, tensile stress acts in the direction to peel the solder resist layer 115 from the pad 124X, and cracks may occur in the solder resist layer 115, i.e., the insulating layer. During the reflow, the bumps 300 melt and expand. For this reason, metal, e.g., solder, of the bumps 300 may flow into the cracks. Therefore, when the cracks generated in the solder resist layer 115 reach other conductors provided around the pad 124X, a short circuit may occur.

The inventors of the present application have investigated in detail the cracks generated in a manner as described above. As a result, it has been found that the above-mentioned crack is likely to occur starting from a pad formed on three or more vias stacked on each other below the peripheral area 201 of the semiconductor chip 200. Furthermore, it has been found that cracks do not occur isotropically, but occur toward the center of the semiconductor chip 200 as seen in the thickness direction of the wiring board 100.

In the first embodiment, as described above, the first pad 124A is formed on the first via 131A, the second via 132A, and the third via 133A overlapping with each other. Therefore, a crack may occur starting from the first pad 124A toward the center of the semiconductor chip 200 as seen in the thickness direction of the wiring board 100. In the first embodiment, a conductor that is, on the side closer to the center of the semiconductor chip 200, closest to the first pad 124A is the second pad 124B. The second pad 124B is farther from the first pad 124A than the conductive trace 124Y around the first pad 124A. Therefore, even if such a crack occurs, the crack can be alleviated and is less likely to reach the conductor around the first pad 124A. Therefore, according to the first embodiment, short circuit caused by cracks in the solder resist layer 115 can be reduced.

First Modified Embodiment of First Embodiment

Figure 5:
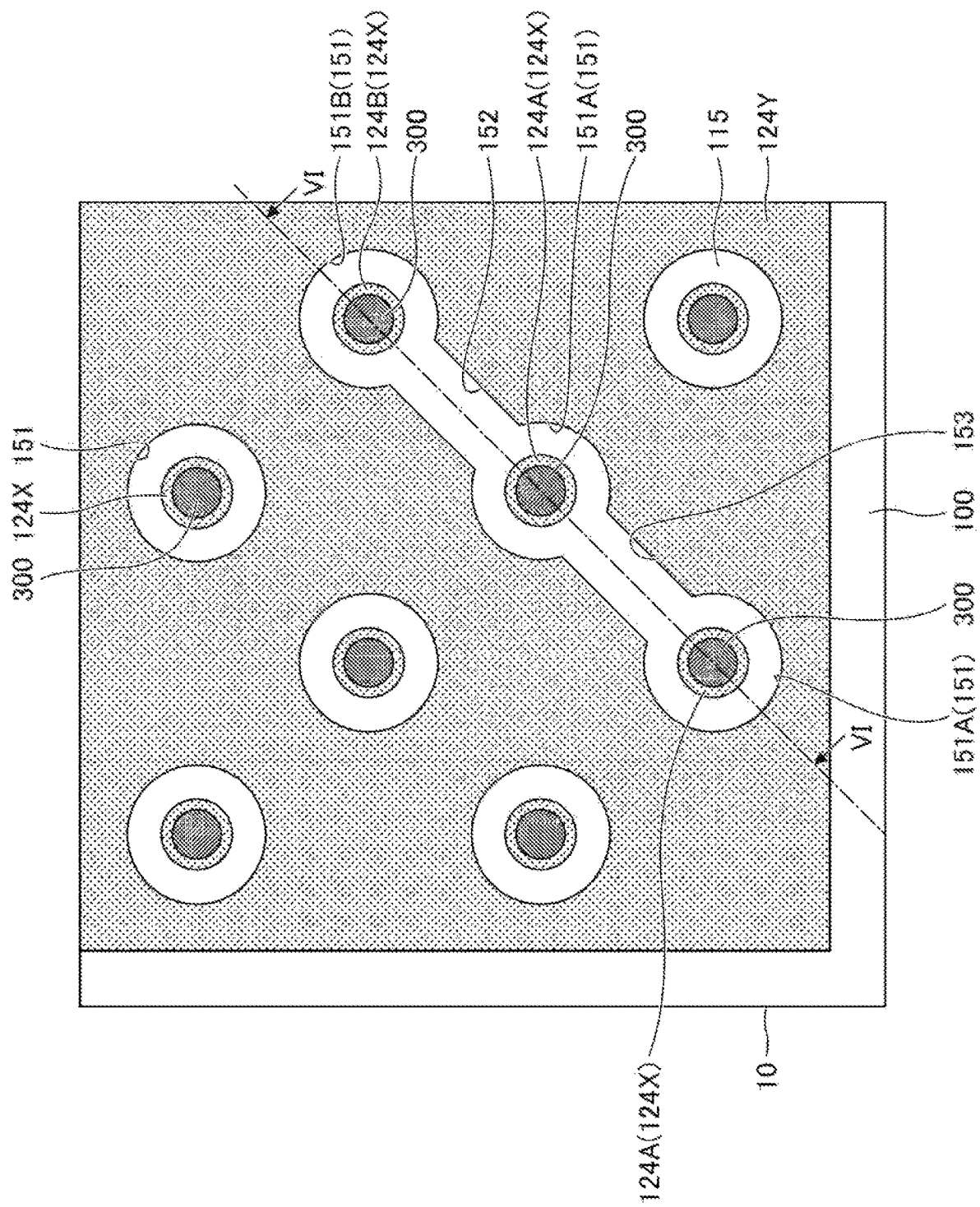
FIG. 5 is a plan view illustrating the area of FIG. 1 according a first modified embodiment of the first embodiment.
Figure 6:
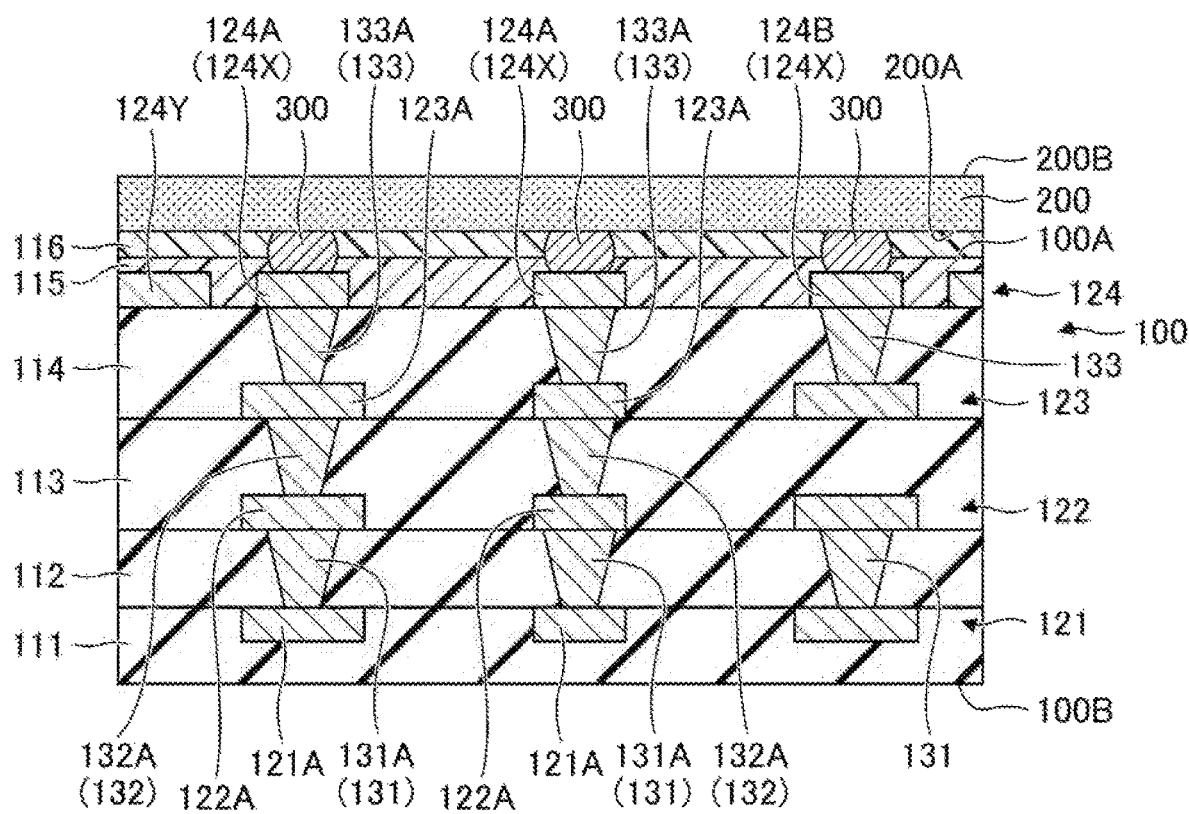
FIG. 6 is a cross sectional view illustrating the area of FIG. 1 according to the first modified embodiment of the first embodiment.

Next, the first modified embodiment of the first embodiment is explained. The first modified embodiment is different from the first embodiment mainly in the arrangement of the vias. FIG. 5 is a plan view illustrating an area 10 according to the first modified embodiment of the first embodiment. In FIG. 5, the bumps 300 and the like are illustrated as if they are seen through the semiconductor chip 200 and the like. FIG. 6 is a cross sectional view, taken along line VI-VI of FIG. 5, illustrating the area 10 according to the first modified embodiment of the first embodiment.

In the first modified embodiment, as illustrated in FIG. 5 and FIG. 6, two combinations of first vias 131A, second vias 132A, and third vias 133A overlapping with each other are arranged next to each other on a straight line extending in a direction from the periphery of the semiconductor chip 200 to the center of the semiconductor chip 200 as seen in the thickness direction of the wiring board 100. The straight line may or may not pass through the center of the semiconductor chip 200. In each combination, on the third via 133A, a first pad 124A connected to the third via 133A is provided. In other words, as seen in the thickness direction of the wiring board 100, one of the two first pads 124A is arranged at a position closer to the center of the semiconductor chip 200 than the other of the two first pads 124A, and the second pad 124B is arranged at a position closer to the center of the semiconductor chip 200 than the other of the two first pads 124A. Further, an opening part 153 is formed to connect an opening part 151A around the other of the two first pads 124A and an opening part 151B around the one of the two first pads 124A. The solder resist layer 115 fills not only the opening parts 151 and 152 but also the opening part 153. Nothing but the solder resist layer 115 may exist between the two neighboring first pads 124A.

The configuration other than the above is similar to the first embodiment.

According to the first modified embodiment, the effects similar to the first embodiment can also be obtained.

Second Modified Embodiment of First Embodiment

Figure 7:
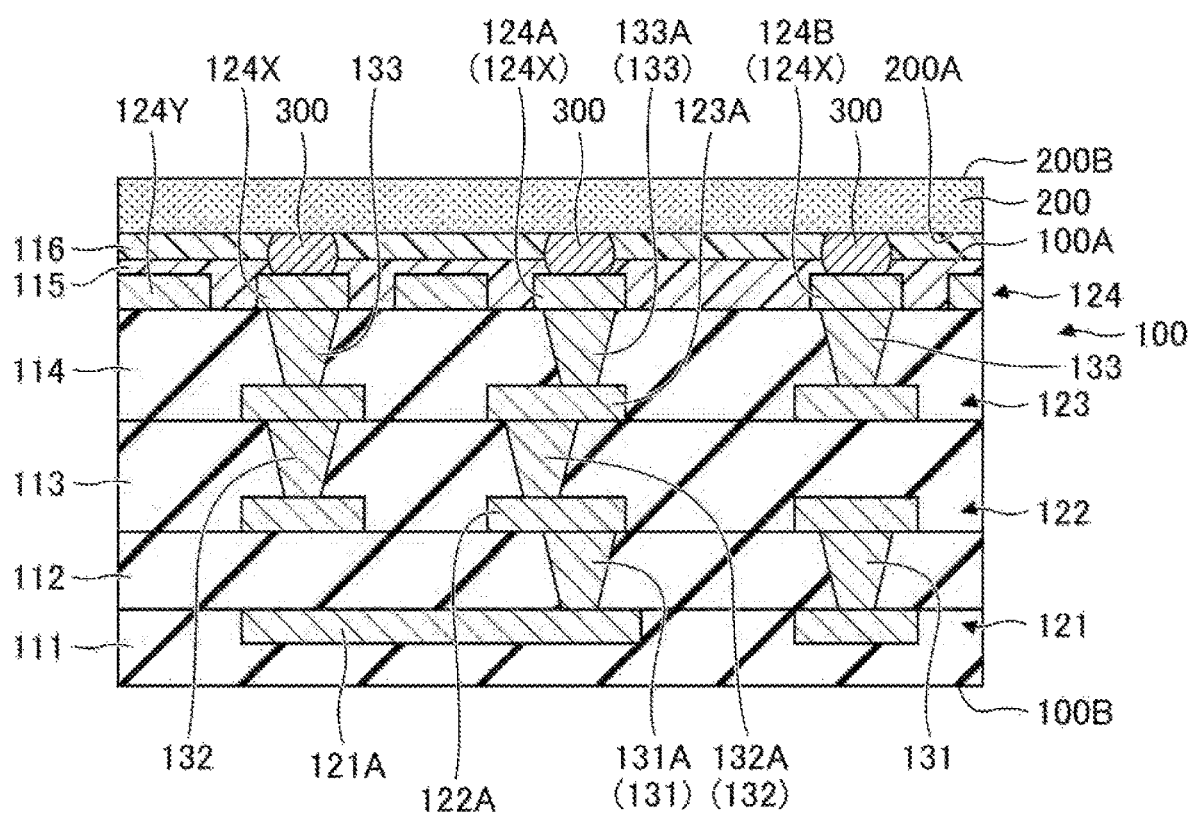
FIG. 7 is a cross sectional view illustrating the area of FIG. 1 according to a second modified embodiment of the first embodiment.

Subsequently, the second modified embodiment of the first embodiment is explained. The second modified embodiment is different from the first embodiment mainly in the arrangement of the vias. FIG. 7 is a cross sectional view, taken along line IV-IV in FIG. 3, illustrating an area 10 according to the second modified embodiment of the first embodiment.

In the second modified embodiment, as illustrated in FIG. 7, as seen in the thickness direction of the wiring board 100, the center of the first via 131A and the center of the third via 133A coincide with each other. The first via 131A and the third via 133A overlap with each other as seen in the thickness direction of the wiring board 100. As seen in the thickness direction of the wiring board 100, the center of the second via 132A is shifted from the center of the first via 131A and the center of the third via 133A. The second via 132A preferably includes a portion overlapping with the first via 131A and the third via 133A as seen in the thickness direction of the wiring board 100.

The configuration other than the above is similar to the first embodiment.

According to the second modified embodiment, the effects similar to the first embodiment can also be obtained. In addition, in the second modified embodiment, the tensile stress acting during the reflow is dispersed in the plane parallel to the first principal surface 100A. Therefore, the occurrence of cracks can be reduced.

Second Embodiment

Figure 8:
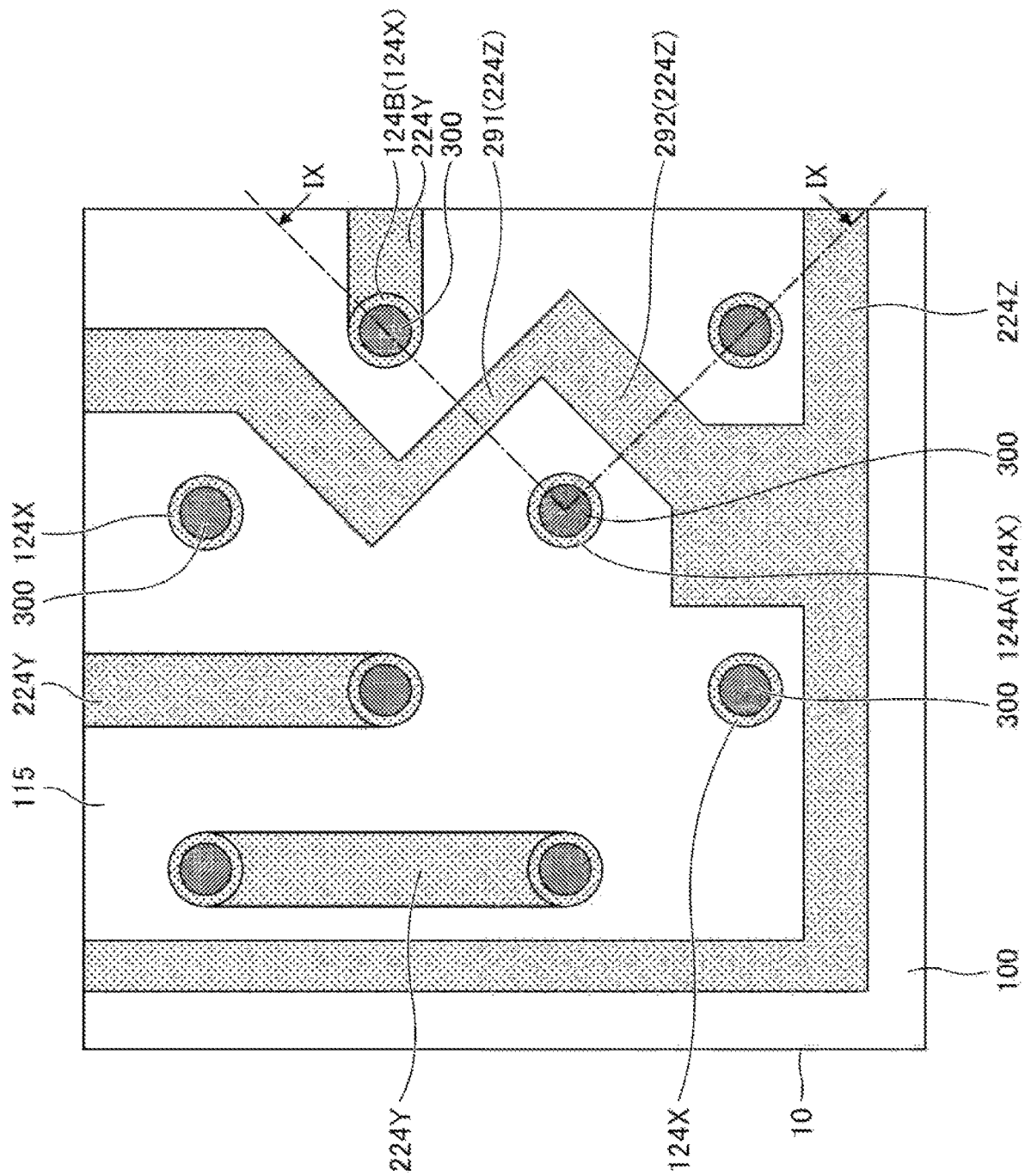
FIG. 8 is a plan view illustrating the area of FIG. 1 according to a second embodiment.
Figure 9:
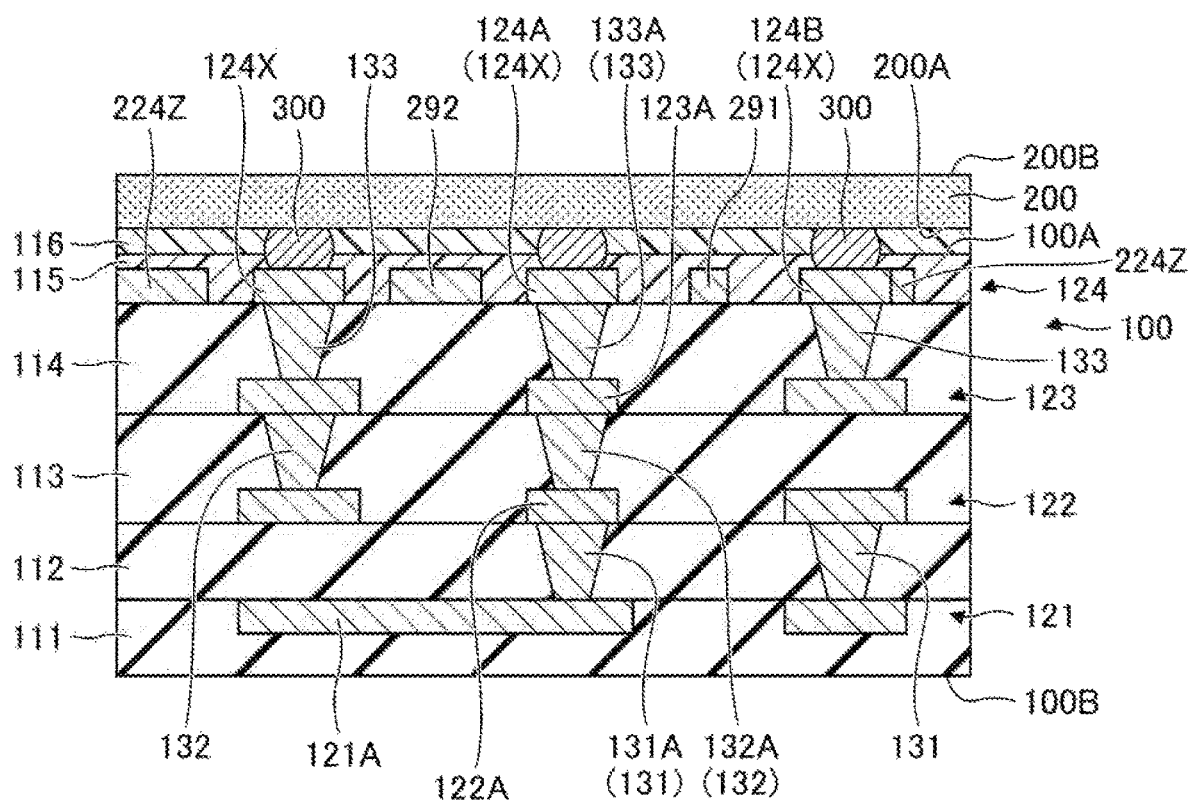
FIG. 9 is a cross sectional view illustrating the area of FIG. 1 according to the second embodiment.

Next, the second embodiment is explained. The second embodiment is different from the first embodiment mainly in the configuration of a conductive trace layer including pads. FIG. 8 is a plan view illustrating an area 10 according to the second embodiment. In FIG. 9, the bumps 300 and the like are illustrated as if they are seen through the semiconductor chip 200 and the like. FIG. 9 is a cross sectional view, taken along line IX-IX of FIG. 3, illustrating the area 10 according to the second embodiment.

In the second embodiment, as illustrated in FIG. 8 and FIG. 9, a fourth conductive trace layer 124 includes conductive traces 224Y and 224Z instead of the conductive trace 124Y formed all over the fourth insulating layer 114. For example, the conductive trace 224Y is connected to the pad 124X, and the conductive trace 224Z is electrically insulated from the pad 124X and the conductive trace 224Y. The conductive trace 224Z includes: a first portion 291 crossing between the first pad 124A and the second pad 124B as seen in the thickness direction of the wiring board 100; and a second portion 292 arranged closer to the first pad 124A than is the first portion 291.

In the second embodiment, a third distance between the first pad 124A and the first portion 291 is larger than a fourth distance between the first pad 124A and the second portion 292. In other words, a conductor that is, on the side closer to the center of the semiconductor chip 200, closest to the first pad 124A is the first portion 291. The first portion 291 is farther from the first pad 124A than the second portion 292. Therefore, even if a crack occurs starting from the first pad 124A toward the center of the semiconductor chip 200 as seen in the thickness direction of the wiring board 100, the crack can be alleviated and is less likely to reach the conductor around the first pad 124A. Therefore, according to the second embodiment, short circuit caused by cracks in the solder resist layer 115 can also be reduced.

The area 10 illustrated in FIG. 1 is located at a corner portion of the semiconductor chip 200 of which the planar shape is a rectangle, but the structure for alleviating the extension of cracks to other conductor bodies according to the above embodiments and modified embodiments is preferably provided not only at the corner portions of the semiconductor chip 200 but also on the entire peripheral area 201.

According to an example, the opening part 151 and the pad 124X are arranged in a grid pattern as seen in the thickness direction of the wiring board 100, but the opening parts 151 and the pads 124X do not have to be located at all grid points, and there may be grid points where the opening part 151 or the pad 124X is not provided.

The vias and the conductive traces on the vias in the wiring board 100 may be integrally formed. For example, the first via 131A and the second conductive trace 122A may be integrally formed. The vias included in the wiring board 100 may also be what are termed as conformal vias.

Although the present invention has been described above with reference to the embodiments and modified embodiments, the present invention is not limited to the features described in the embodiments and modified embodiments. These features can be changed without departing from the gist of the present invention, and can be appropriately determined according to the implementation to which the present invention is applied.

According to the present disclosure, short-circuits due to cracks can be reduced.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device comprising:
 a wiring board;
 a semiconductor chip arranged on the wiring board; and
 a plurality of bumps arranged between the wiring board and the semiconductor chip to connect the wiring board and the semiconductor chip,
 wherein the wiring board includes:
  a first conductive trace layer including a first conductive trace;
  a second conductive trace layer arranged on the first conductive trace layer and including a second conductive trace;
  a third conductive trace layer arranged on the second conductive trace layer and including a third conductive trace;
  a first conductor arranged on the third conductive trace layer;
  a second conductor arranged on the third conductive trace layer and electrically insulated from the first conductor;
  a third conductor arranged on the third conductive trace layer and electrically insulated from the first conductor;
  a first via connecting the first conductive trace and the second conductive trace;
  a second via connecting the second conductive trace and the third conductive trace; and
  a third via connecting the third conductive trace and the first conductor,
 wherein the first conductor, the second conductor, and the third conductor are provided in a plane parallel to a principal surface of the wiring board,
 one of the plurality of bumps is arranged on the first conductor,
 the second conductor is arranged at a position closer to a center of the semiconductor chip than the first conductor is to the center, as seen in a thickness direction of the wiring board,
 the first conductor and the second conductor are arranged next to each other without another conductor interposed between the first conductor and the second conductor, as seen in the thickness direction of the wiring board,
 the third conductor is spaced apart from the first conductor and the second conductor, as seen in the thickness direction of the wiring board, and
 a first distance between the first conductor and the second conductor is larger than a second distance between the first conductor and the third conductor.

2. The semiconductor device according to claim 1, wherein the third conductor is electrically insulated from the second conductor.

3. The semiconductor device according to claim 1, wherein the second conductor and the third conductor are formed from a same conductive film.

4. The semiconductor device according to claim 1, wherein the first conductor is arranged below a peripheral area of the semiconductor chip.

5. The semiconductor device according to claim 1, wherein the plurality of bumps are arranged in a lattice arrangement, as seen in the thickness direction of the wiring board.

6. The semiconductor device according to claim 1, wherein the first via, the second via, and the third via overlap with each other, as seen in the thickness direction of the wiring board.

7. The semiconductor device according to claim 1, wherein a center of at least one of the first via, the second via, and the third via is shifted from a center of remaining one or more of the first via, the second via, and the third via, as seen in the thickness direction of the wiring board.

8. The semiconductor device according to claim 1, further comprising:
   an insulating layer formed on the first conductor, the second conductor, and the third conductor.

\* \* \* \* \*